United States Patent
Tolson

(10) Patent No.: US 6,622,009 B1
(45) Date of Patent: Sep. 16, 2003

(54) RADIOTELEPHONE TRANSMITTER/RECEIVER

(75) Inventor: Nigel James Tolson, Berkshire (GB)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/433,347

(22) Filed: Nov. 4, 1999

(30) Foreign Application Priority Data

Nov. 5, 1998 (GB) .............................................. 9824222

(51) Int. Cl.⁷ ................................................ H04B 1/40
(52) U.S. Cl. ........................................ 455/76; 455/118
(58) Field of Search .......................... 455/73, 260, 264, 455/77, 76, 119, 118, 75, 84; 375/344

(56) References Cited

U.S. PATENT DOCUMENTS

| | | | | |
|---|---|---|---|---|
| 3,936,593 A | * | 2/1976 | Aaronson et al. ............ | 380/219 |
| 4,630,283 A | * | 12/1986 | Schiff .......................... | 329/325 |
| 4,639,932 A | * | 1/1987 | Schiff .......................... | 375/147 |
| 5,230,088 A | * | 7/1993 | Kramer et al. ............... | 375/327 |
| 5,387,913 A | * | 2/1995 | Park et al. ................... | 431/344 |
| 5,539,770 A | * | 7/1996 | Ishigaki ....................... | 375/141 |
| 6,108,529 A | * | 8/2000 | Vice et al. .................... | 74/31 |
| 6,208,875 B1 | * | 3/2001 | Damgaard et al. .......... | 455/260 |

FOREIGN PATENT DOCUMENTS

| | | |
|---|---|---|
| GB | 2 320 629 | 6/1998 |
| GB | 98 21949.6 | 10/1998 |
| WO | WO 93/09606 | 5/1993 |
| WO | WO 98/20623 | 5/1998 |

OTHER PUBLICATIONS

Behzad Razavi, "Recent Advances in RF Integrated Circuits", *IEEE Communications Magazine*, Dec. 1997, pp. 36–43.

R. W. Stewart et al., "Oversampling and sigma–delta strategies for data conversion", *Electronics & Communication Engineering Journal*, Feb. 1998, pp. 37–47.

Norman M. Filiol et al., "An Agile ISM Band Frequency Synthesizer with Built–In GMSK Data Modulation", *IEEE Journal of Solid–State Circuits*, vol. 33, No. 7, Jul. 1998, pp. 998–1008.

* cited by examiner

*Primary Examiner*—Nguyen T. Vo
(74) *Attorney, Agent, or Firm*—Sughrue Mion, PLLC

(57) ABSTRACT

A part of the output signal from the voltage control oscillator is down-converted by the down-converting means. The down-converted signal is compared with a modulation signal by the phase detector. The signal has amplitude and polarity based on the comparison effected between the down-converted signal and the modulation signal is provided to the voltage control oscillator. The voltage control oscillator outputs a signal has frequency based on the applied signal.

17 Claims, 2 Drawing Sheets

RADIOTELEPHONE TRANSMITTER/RECEIVER

BACKGROUND OF THE INVENTION

1. Field of the Invention

This invention relates to radiotelephone transmitter/receivers and in particular, but not exclusively it relates to transmitter tracking loops for radiotelephones.

2. Description of the Related Art

Reference is made to the following papers for technological background material relating to the invention:

"Recent Advances in RF Integrated Circuits" by Behzad Razavi published in IEEE Communications Magazine December 1997.

"Oversampling and sigma-delta strategies for data conversion" by R. W. Stewart and E. Pfann published in Electronics & Communication Engineering Journal February 1998.

"An Agile ISM (Industrial, Scientific and Medical use) Band Frequency Synthesizer with Built-In GMSK Modulation" by Norman M. Filiol, Thomas A. D. Riley, Calvin Plett and Miles A. Copeland published in IEEE Journal of Solid-State circuits, Vol 33, no. 7 July 1998.

UK patent application GB 2 320 629 A.

It is now a common practice to make use of a tracking loop architecture for mobile phones for operation with GSM (Global System for Mobile communications, formerly Groupe Special Mobile). This tracking loop architecture uses a Voltage controlled oscillator (VCO) operating at the required transmission frequency to provide the output carrier frequency i.e. an "on-channel" transmitter. The transmitter VCO is phase locked and within the loop bandwidth of this VCO the modulated data passes. Through the process of down conversion and phase detection, the modulation on the output of the VCO is-compared with the original (desired) modulation. The negative feedback thereby implemented provides for accurate reproduction of the modulation at radio frequency.

Fabrication of this type of system requires a significant area of RF silicon for the down converter, high frequency phase detector and quadrature modulator. Owing to the low yield and the quantity of wafers used for implementation of circuits in RF Silicon, costs for RF Silicon are relatively high when compared with standard CMOS circuitry. For this reason it is desirable to implement such a modulation loop but using only CMOS technology and so allowing for integration with the base band circuitry.

SUMMARY OF THE INVENTION

It is therefore an object of the present invention to provide a radiotelephone transmitter/receiver reducing its cost and size.

According to the invention a part of the output signal from the voltage control oscillator is down-converted by the down-converting means. The down-converted signal is compared with a modulation signal by the phase detector. The signal has amplitude and polarity based on the comparison effected between the down-converted signal and the modulation signal is provided to the voltage control oscillator. The voltage control oscillator outputs a signal has frequency based on the applied signal.

DETAILED DESCRIPTION OF THE PREFERRED EMBODIMENTS

One example of the invention will now be described with reference to the figures.

Figure 1:
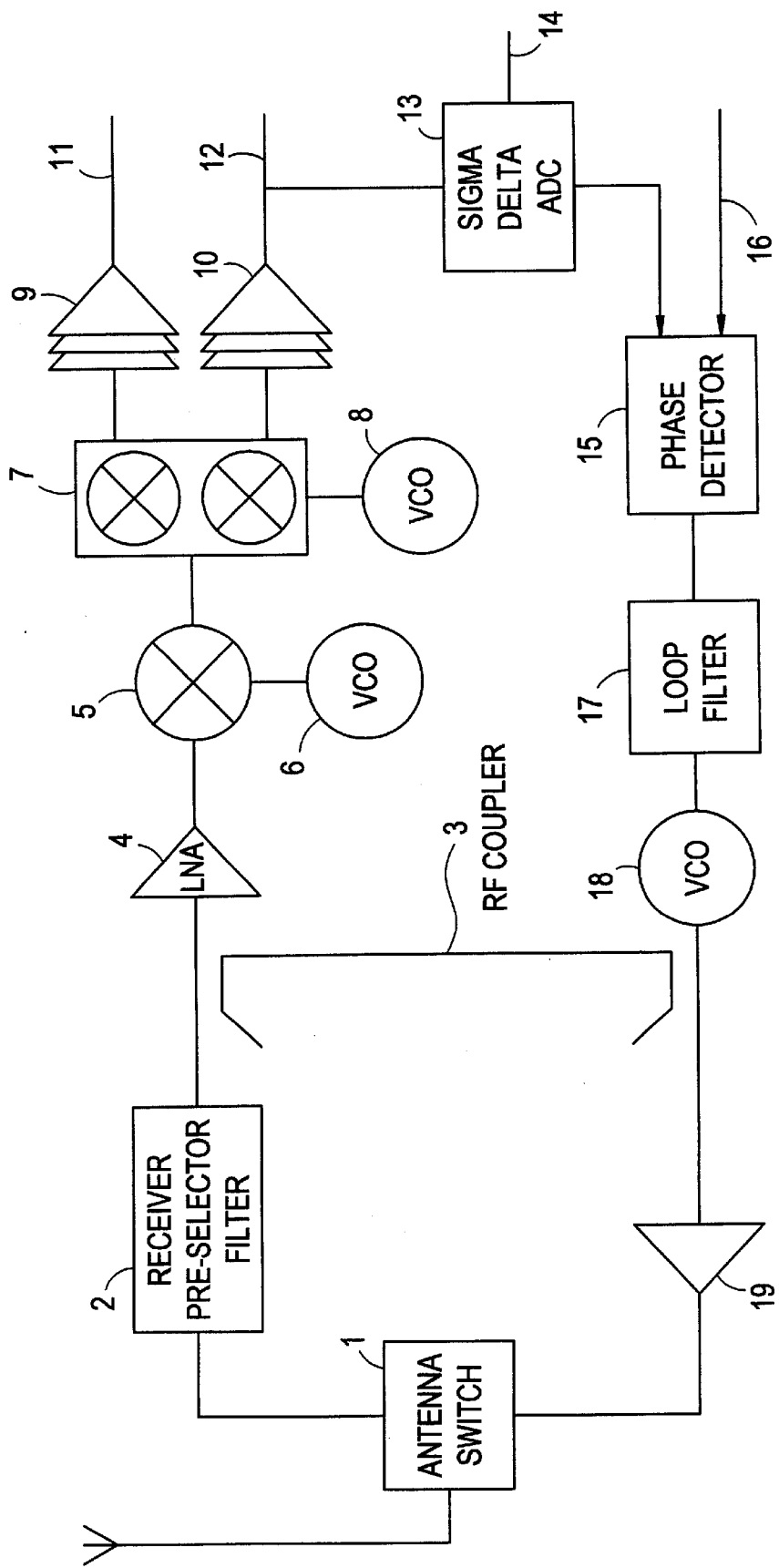
FIG. 1 is a functional block diagram of a radiotelephone transmitter/receiver constructed in accordance with the invention.

FIG. 1 is a functional block diagram of a radiotelephone transmitter/receiver constructed in accordance with the invention.

With reference to FIG. 1, the radiotelephone transmitter/receiver according to the present invention comprises an antenna switch 1, a receiver pre-selector filter 2, an RF coupler 3, a low noise amplifier (LNA) 4, image rejection mixer 5 as first mixer, first voltage control oscillator (VCO) 6, second mixer 7, second voltage control oscillator (VCO) 8, amplifiers 9, 10 for providing I (in-phase) and Q (quadrature) baseband signals via signal lines 11, 12 to baseband processing circuits (not shown), a Sigma Delta ADC 13 for encoding the output from amplifier 10 based on a clocking input 14, and phase detector 15 for comparing the phase of the output from Sigma Delta ADC 13 and the serial data stream modulation 16, loop filter 17 receiving the output form phase detector 15, on-channel voltage control oscillator (VCO) 18 for outputting a signal via loop filter 17, and power amplifier 19 for amplifying the output from the VCO 18. The signal amplified by power amplifier 19 is transmitted via antenna switch 1.

As can be seen in FIG. 1, a transmitter tracking loop has been implemented in which the majority of the components of the transmitter tracking loop are common to the receiver. Part of the output of VCO 18 is coupled to the input of LNA 4 by means of coupler 3. The part of the transmitter signal coupled to the input of LNA 4 is down-converted in mixers 5 and 7 to I and Q baseband signals at signal lines 11, 12.

A sample of the receiver output at signal line 12 is input to signal delta ADC 13. The receiver output sampled may be either single ended as shown in FIG. 1 or in quadrature where both I and Q outputs are connected to sigma delta ADC 13. When a single ended connection is utilized then the digital modulation signal at 16 needs to have an off-set in frequency (say 1 MHz), so that the phase information can be preserved. If quadrature receiver output signals are used then no frequency off-set is required but the phase information needs to be extracted from the I and Q lines after sampling by a digital signal processor (not shown).

In the system shown in FIG. 1 a single ended output from the receiver is taken to the sigma delta ADC 13 where it is encoded signal is fed as an input to phase detector 15. The modulation signal 16 is also an input to phase detector 15 and the output voltage from the phase detector 15 represents the instantaneous phase difference of the two input signals.

The output from phase detector 15 is applied via loop filter 17 to the frequency control input of the transmitter VCO 18. The amplitude and polarity of the voltage applied to the frequency control input of the transmitter VCO 18 is therefore dependent on the phase comparison effected at baseband between the down-converted part of the transmitter VCO 18 signal and the modulation signal so completing the negative feedback loop. The output from the VCO 18 will be driven to provide an input to phase detector 15 to match the modulation input to phase detector 15 from 16.

Channel selection for the transmitter is provided in the usual way by the low power off-set VCO's 6 and 8. Where a single ended receiver connection is established for the feedback loop, as in FIG. 1, the off-set frequency needs to be taken in account when selecting the channel (i.e. subtract 1 MHz).

Figure 2:
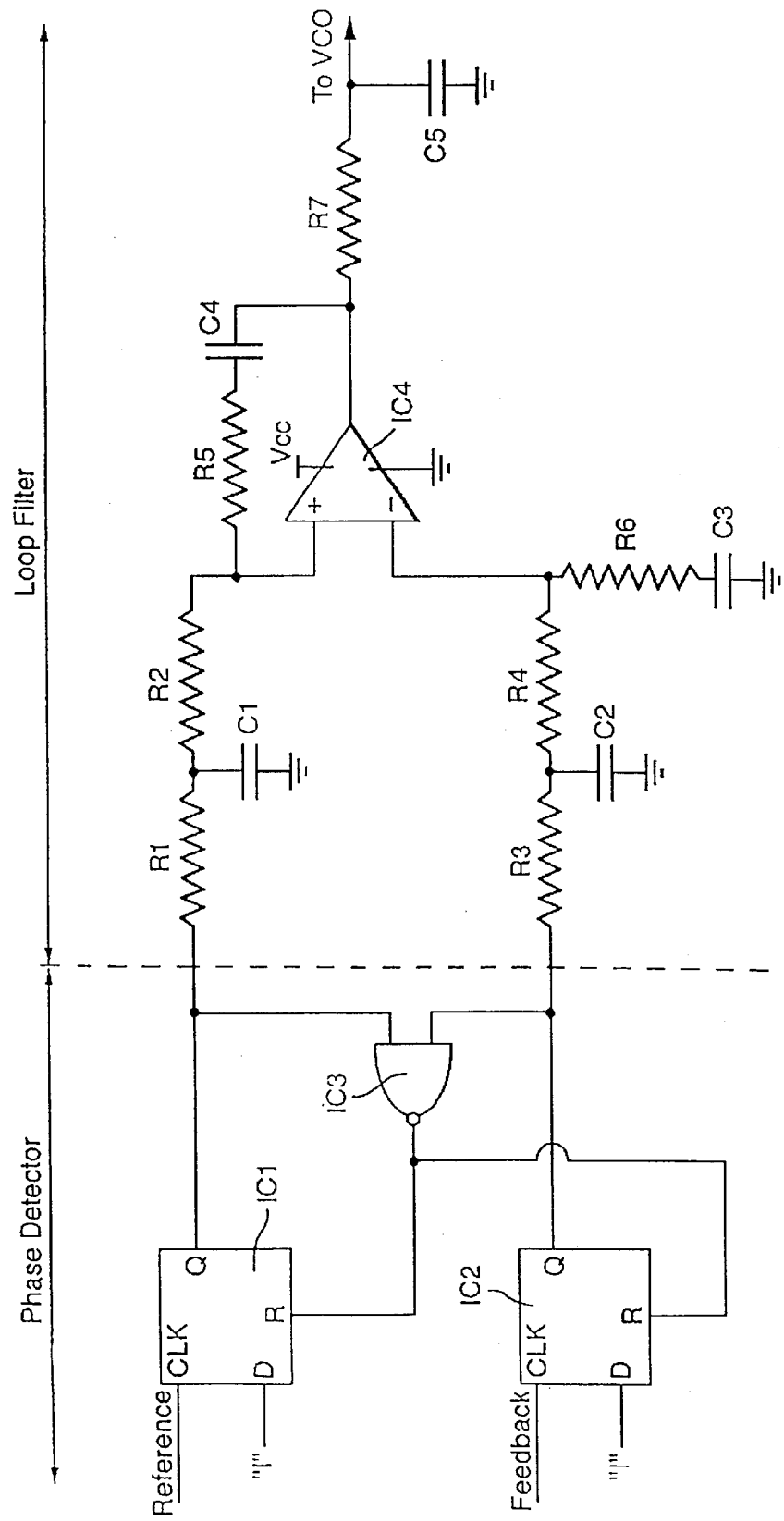
FIG. 2 is circuit diagram of the phase detector and loop filter shown in FIG. 1.

FIG. 2 is circuit diagram of the phase detector and loop filter shown in FIG. 1.

As shown FIG. 2, the phase detector 15 and loop filter 17 has four integrated circuits of which IC1 and IC2 are D type flip flops, IC3 is a two input NAND gate and IC4 is an operational amplifier. The D values of IC1 and IC2 are held at unity, the reference frequency is fed as the clock input to IC1 and the feedback frequency is applied to the clock input of IC2. The D type flip flops IC1 and IC2 transfer the unity D value on the rising edge of the clock input.

When the "Q" outputs of both IC1 and IC2 are high, both of IC1 and IC2 are reset by the NAND gate IC3. Therefore when phase lock of the loop is achieved a narrow pulse OR race condition is present at the inputs of R1 and R3. The magnitude of the phase pulses into IC4 is reduced by R1, C1 and R3, C2. Closed loop frequency response of the phase locked loop is provided by IC4 and selection of the capacitances and resistances connecting IC4 to the remaining circuitry.

The receiver will need to act as a broad band IF system (i.e. no IF filter) when the transmitter/receiver is in transmit mode. The exemplary implementation given relates to a transmitter/receiver in which the receiver operates as a heterodyne receiver. The invention may also be implemented with a transmitter/receiver in which the receiver is a homodyne receiver. Examples of receivers both heterodyne and homodyne suitable for use with the invention are given in our co-pending UK patent application GB 9821949.6.

As can be seen from FIG. 1 the high power transmitter VCO 18 and coupler 3 are the only additional RF transmitter components, as all other RF components are required for the normal operation of the receiver. The coupler 3 may be replaced by a switch.

A significant reduction in cost and size of the transmitter is therefore obtained from implementation of the present invention.

Other advantages are able to be realised in respect of the baseband architecture which can be simplified since no Digital to Analogue Converters are necessary to drive the normal quadrature modulator.

Additionally it is possible to make use of self test features added to the radio transceiver because both the transmitter and receiver are used in transmit.

What is claimed is:

1. A radiotelephone transmitter/receiver, comprising:
   a voltage control oscillator for outputting a signal having a frequency based on an applied signal;
   down-converting means for down-converting a part of the output signal from said voltage control oscillator;
   a phase detector for comparing phases of the output signal from said down-converting means and a modulation signal, and outputting a signal having an amplitude and a polarity based on the comparison between the output signal from said down-converting means and the modulation signal; and
   analog/digital converting means for encoding the output signal from said down-converting means;
   wherein said voltage control oscillator outputs a signal that has a frequency based on the signal outputted from said detector, and said phase detector compares phases of the output signal from said analog/digital converting means and the modulation signal and outputs a signal which has said amplitude and said polarity based on the comparison effected between the output signal from said analog/digital converting means and the modulation signal.

2. A radiotelephone transmitter/receiver according to claim 1, wherein the down converting means for down-conversion of said part of the voltage control oscillator to baseband is a heterodyne broadband IF receiver.

3. A radiotelephone transmitter/receiver according to claim 2, wherein a part of the output from said voltage control oscillator is fed to an input of said down converting means by an RF coupler.

4. A radiotelephone transmitter/receiver according to claim 1, wherein the down-converting means for down-conversion of said part of the voltage control oscillator to baseband is a homodyne receiver.

5. A radiotelephone transmitter/receiver according to claim 4, wherein a part of the output from said voltage control oscillator is fed to an input of said down converting means by an RF coupler.

6. A radiotelephone transmitter/receiver according to claim 1, wherein a part of the output from said voltage control oscillator is fed to an input of said down converting means by an RF coupler.

7. A radiotelephone transmitter/receiver, comprising:
   a voltage control oscillator for outputting a signal having a frequency based on an applied signal;
   down-converting means for down-converting a part of the output signal from said voltage control oscillator;
   a phase detector for comparing phases of the output signal from said down-converting means and a modulation signal, and outputting a signal having an amplitude and a polarity based on the comparison between the output signal from said down-converting means and the modulation signal; and
   sigma-delta digital converting means for encoding the output signal from said down-converting means;
   wherein said voltage control oscillator outputs a signal that has a frequency based on the signal outputted from said detector, and said phase detector compares phases of the output signal from said sigma-delta digital converting means and the modulation signal and outputs a signal which has said amplitude and said polarity based on the comparison effected between the output signal from said sigma-delta digital converting means and the modulation signal.

8. A radiotelephone transmitter/receiver according to claim 7, wherein the down-converting means for down-conversion of said part of the voltage control oscillator to baseband is a heterodyne broadband IF receiver.

9. A radiotelephone transmitter/receiver according to claim 8, wherein a part of the output from said voltage control oscillator is fed to an input of said down converting means by an RF coupler.

10. A radiotelephone transmitter/receiver according to claim 7, wherein the down-converting means for down-conversion of said part of the voltage control oscillator to baseband is a homodyne receiver.

11. A radiotelephone transmitter/receiver according to claim 10, wherein a part of the output from said voltage control oscillator is fed to an input of said down converting means by an RF coupler.

12. A radiotelephone transmitter/receiver according to claim 7, wherein a part of the output from said voltage control oscillator is fed to an input of said down converting means by an RF coupler.

13. A radiotelephone transmitter/receiver, comprising:
   a voltage control oscillator for outputting a signal having a frequency based on an applied signal;
   down-converting means for down-converting a part of the output signal from said voltage control oscillator; and a phase detector for comparing phases of the output signal from said down-converting means and a modulation signal, and outputting a signal having an amplitude and a polarity based on the comparison between the output signal from said down-converting means and the modulation signal;

wherein said voltage control oscillator outputs a signal that has a frequency based on the signal outputted from said detector, and the down-converting means for down-conversion of said part of the voltage control oscillator to baseband is a heterodyne broadband IF receiver.

14. A radiotelephone transmitter/receiver according to claim 13, wherein a part of the output from said voltage control oscillator is fed to an input of said down converting means by an RF coupler.

15. A radiotelephone transmitter/receiver, comprising:

a voltage control oscillator for outputting a signal having a frequency based on an applied signal;

down-converting means for down-converting a part of the output signal from said voltage control oscillator; and a phase detector for comparing phases of the output signal from said down-converting means and a modulation signal, and outputting a signal having an amplitude and a polarity based on the comparison between the output signal from said down-converting means and the modulation signal;

wherein said voltage control oscillator outputs a signal that has a frequency based on the signal outputted from said detector, and the down-converting means for down-conversion of said part of the voltage control oscillator to baseband is a homodyne receiver.

16. A radiotelephone transmitter/receiver according to claim 15, wherein a part of the output from said voltage control oscillator is fed to an input of said down converting means by an RF coupler.

17. A radiotelephone transmitter/receiver, comprising:

a voltage control oscillator for outputting a signal having a frequency based on an applied signal;

down-converting means for down-converting a part of the output signal from said voltage control oscillator; and a phase detector for comparing phases of the output signal from said down-converting means and a modulation signal, and outputting a signal having an amplitude and a polarity based on the comparison between the output signal from said down-converting means and the modulation signal;

wherein said voltage control oscillator outputs a signal that has a frequency based on the signal outputted from said detector, and the receiver of the transmitter/receiver for down-conversion of part of the voltage control oscillator to baseband is a broadband intermediate frequency (IF) system without an IF filter.

* * * * *